US009785207B1

(12) United States Patent
Xu et al.

(10) Patent No.: US 9,785,207 B1
(45) Date of Patent: Oct. 10, 2017

(54) SERVER

(71) Applicants: INVENTEC (PUDONG) TECHNOLOGY CORPORATION, Shanghai (CN); INVENTEC CORPORATION, Taipei (TW)

(72) Inventors: Ji-Peng Xu, Shanghai (CN); Jia-Bin Wang, Shanghai (CN); Hui Zhu, Shanghai (CN); Shu-Min Wang, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 15/271,042

(22) Filed: Sep. 20, 2016

(30) Foreign Application Priority Data

Sep. 7, 2016 (CN) .......................... 2016 1 0807801

(51) Int. Cl.
*H05K 7/20* (2006.01)
*G06F 1/18* (2006.01)
*G06F 1/20* (2006.01)

(52) U.S. Cl.
CPC ................ *G06F 1/187* (2013.01); *G06F 1/20* (2013.01); *H05K 7/20172* (2013.01)

(58) Field of Classification Search
CPC ............................................ G06F 1/185–1/187
See application file for complete search history.

(56) References Cited

U.S. PATENT DOCUMENTS

| 6,129,556 | A | * | 10/2000 | Sihn | .................... | G06F 1/184 |
| | | | | | | 361/785 |
| 8,369,092 | B2 | * | 2/2013 | Atkins | ................... | G06F 1/187 |
| | | | | | | 361/727 |
| 9,606,589 | B2 | * | 3/2017 | Gallina | .................. | G06F 1/185 |
| 2002/0119682 | A1 | * | 8/2002 | Schmid | ................. | G06F 1/184 |
| | | | | | | 439/65 |
| 2013/0329377 | A1 | * | 12/2013 | Berner | ................ | F15B 13/0839 |
| | | | | | | 361/729 |
| 2015/0062833 | A1 | * | 3/2015 | Ismayilov | .............. | H05K 3/32 |
| | | | | | | 361/730 |

* cited by examiner

*Primary Examiner* — Anthony Q Edwards
(74) *Attorney, Agent, or Firm* — Maschoff Brennan

(57) ABSTRACT

A server includes a main board, a plurality of first expanding modules, a plurality of second expanding modules, a plurality of third expanding modules and a management controlling board. The main board has a first edge, a second edge corresponding to the first edge, a first plane, a second plane corresponding to the first plane. The main board includes a plurality of hardware connectors disposed on the first plane and between the first edge and the second edge. The plurality of first expanding modules, the plurality of second expanding modules and the plurality of third expanding modules are all disposed on the second edge and on the first plane. Each of the first expanding modules has a first Ethernet connector and a plurality of first ports configured to connect to a first external server. Each of the second expanding modules has a plurality of second ports configured to connect to a second external server. The management controlling board is disposed on the second edge and on the second plane. The management controlling board has a plurality of second Ethernet connectors.

8 Claims, 6 Drawing Sheets

SERVER

CROSS-REFERENCE TO RELATED APPLICATIONS

This non-provisional application claims priority under 35 U.S.C. §119(a) on Patent Application No(s). 201610807801.8 filed in China on Sep. 7, 2016, the entire contents of which are hereby incorporated by reference.

BACKGROUND

Technical Field

This disclosure relates to a server, and more particularly to a server with storage device conforming to non-volatile memory express (NVMe).

Related Art

High-speed peripheral component interconnect express (PCIe) is capable of providing a better transmission speed and quality because PCIe has the property of point-to-point serial connection and does not need to ask whole bus for bandwidth. With the rapid development of high-speed PCIe, every manufacturer launches the storage device of PCIe actively. However, the storage devices of PCIe launched by different manufacturers have different appearances, sizes, drivers and specifications of PCIe. It leads to the adaptability problem of the storage device of PCIe. With the participation of major manufacturers, non-volatile memory express (NVMe), which is the standard based on the solid state disks (SSD) of PCIe, has been developed. With NVMe, the SSD of PCIe has great adaptability on every operation platform. Therefore, providing a store type server which has high precision and conforms to NVMe is an important trend.

SUMMARY

One embodiment in the disclosure provides a storage type server having high precision, supporting storage device with high capacity and disassembled easily.

According to an embodiment, the disclosure provides a server including a main board, multiple first expanding modules, multiple second expanding modules, multiple third expanding modules and a management controlling board. The main board has a first edge, a second edge corresponding to the first edge, a first plane, and a second plane corresponding to the first plane. The main board includes multiple hardware connectors and is disposed on the first plane and between the first edge and the second edge. The main board is coupled to multiple hardware components via the hardware connectors. The main board further includes multiple first connectors, multiple second connectors and multiple third connectors. The multiple first expanding modules are disposed at the second edge and on the first plane. Each of the first expanding modules has a first Ethernet connector, a first plugger and multiple first connecting ports. Each of the first expanding modules is coupled to the main board via one of the first connectors which is coupled to the first plugger. The first connecting ports are used for connecting to a first external server. The multiple second expanding modules are disposed at the second edge and on the first plane. Each of the second expanding modules has a second plugger and multiple second connecting ports. Each of the second expanding modules is coupled to the main board via one of the second connectors which is coupled to the second plugger. The second connecting ports are used for connecting to a second external server. The multiple third expanding modules are disposed at the second edge and on the first plane. Each of the third expanding modules has a third plugger, and is coupled to the main board via one of the third connectors which is coupled to the third plugger. The management controlling board which is disposed at the second edge and on the second plane has multiple second Ethernet connectors. Moreover, each of the multiple first expanding modules is not adjacent with each other, each of the multiple second expanding modules is not adjacent with each other, and each of the multiple third expanding modules is not adjacent with each other.

In the view of the above description, the server in one embodiment in the disclosure is coupled to multiple hardware components (e.g. solid state disks, hard disk drives, or other kinds of storage devices) via highly dense hardware connectors of the main board, and operates via multiple first expanding modules, multiple second expanding modules and multiple third expanding modules which are coupled to a main board.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
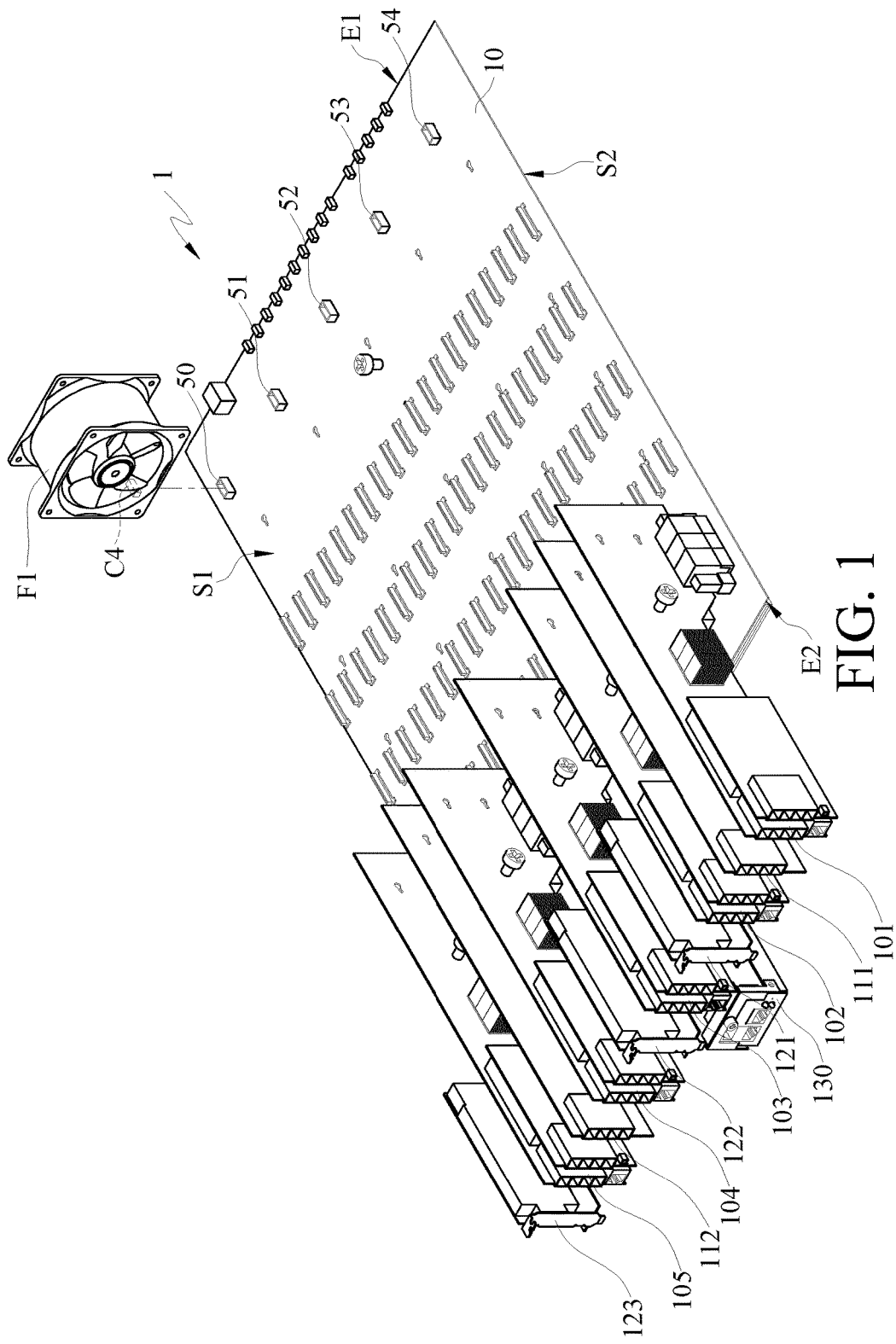
FIG. 1 is an internal architecture diagram of a server in an embodiment.
Figure 2:
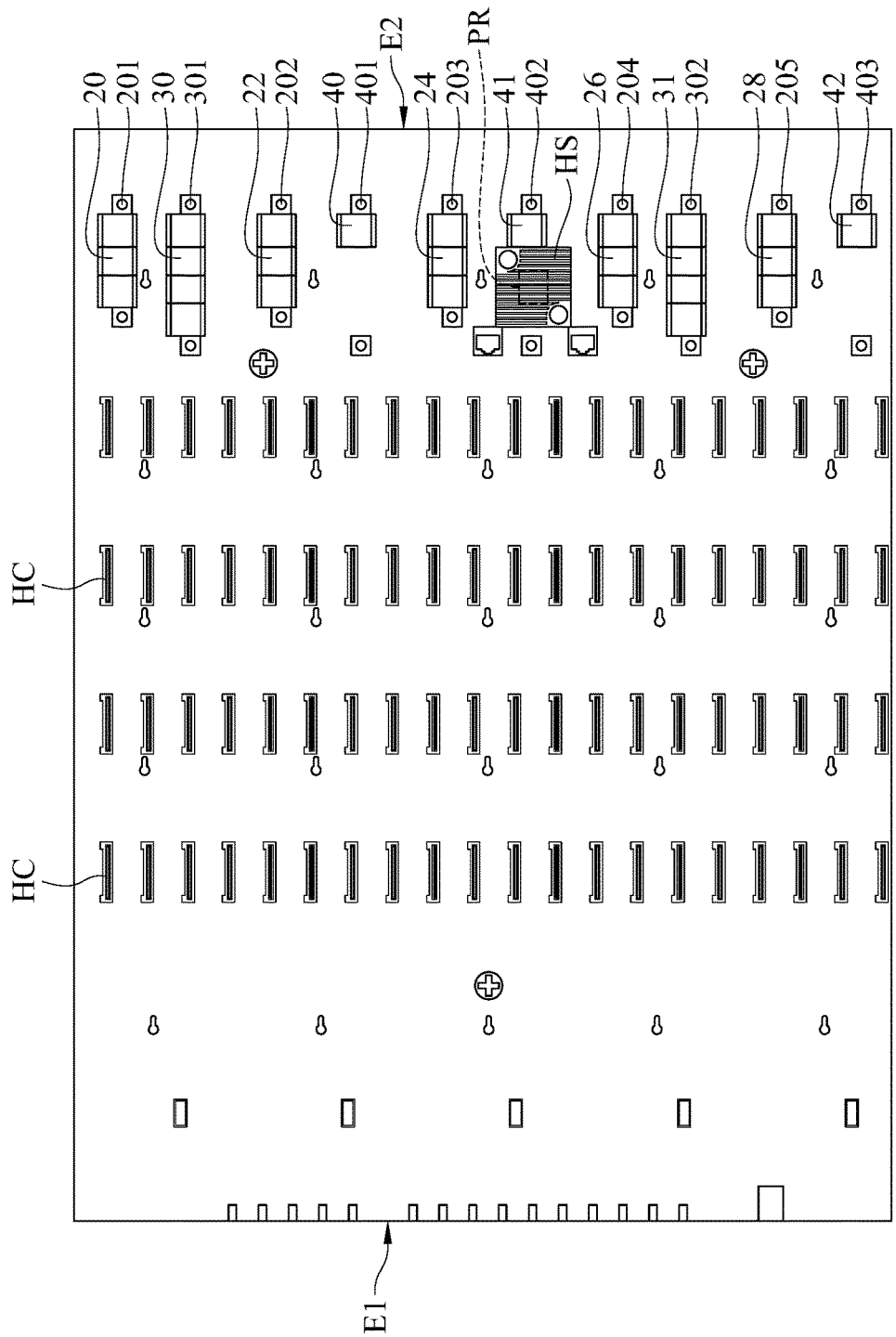
FIG. 2 is a top view of a main board in an embodiment.

Please refer to FIG. 1, an internal architecture diagram of a server in an embodiment. As shown in FIG. 1, server 1 includes a main board 10, multiple first expanding modules 101-105, multiple second expanding modules 111-112, multiple third expanding modules 121-123 and a management controlling board 130. The main board 10 has a first edge E1, a second edge E2 which is opposite to the first edge E1, a first plane S1, and a second plane S2 which is opposite to the first plane S1. Please refer to FIG. 1 and FIG. 2. FIG. 2 is a top view of a main board in an embodiment. As shown in FIG. 2, the main board 10 includes multiple hardware connectors HC. The multiple hardware connectors HC are disposed on the first plane S1 and between the first edge E1 and the second edge E2. In an embodiment, the main board 10 is coupled to multiple hardware components via the multiple hardware connectors HC of the first plane S1. In an embodiment, the above hardware components are multiple hard disks.

In an embodiment, the hard disks are hard disk drives (HDD) or solid state disks (SSD) which conform to non-volatile memory express (NVMe). In practice, the hard disks transmit data to other devices of the main board 10 via the hardware connectors HC of the first plane S1, and the number of the hard disks is adjusted based on actual demand. In an embodiment, only SSDs are disposed on the main board 10. In an embodiment, only HDDs are disposed on the main board 10. In another embodiment, HDDs and SSDs are mixedly disposed on the main board 10. For example, part of hardware connectors HC is coupled to HDDs, and the other part of hardware connectors HC is coupled to SSDs.

Figure 3:
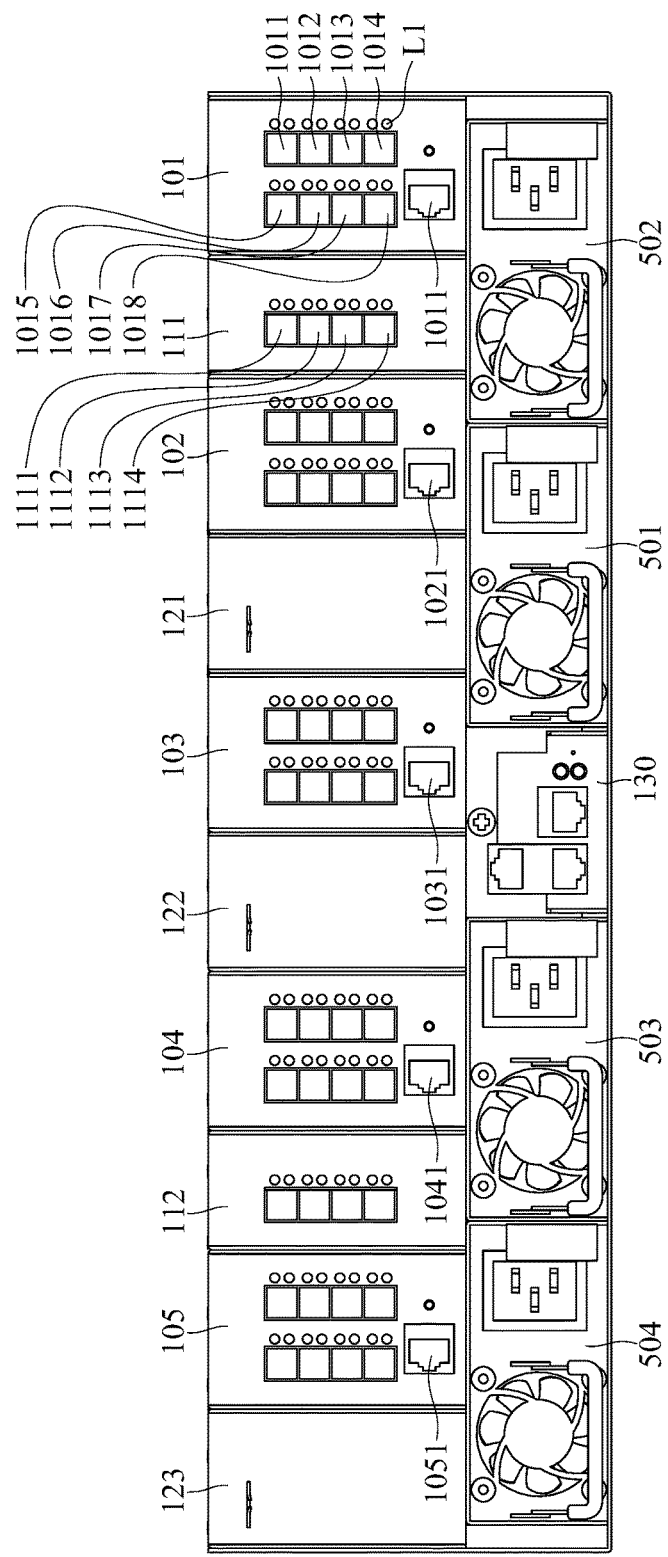
FIG. 3 is a rear view of a server in an embodiment.

Please refer to FIG. 1 and FIG. 3. FIG. 3 is a rear view of a server in an embodiment. As shown in FIG. 1, multiple first expanding modules 101-105 are disposed at the second edge E2 of the main board 10 and on the first plane S1. As shown in FIG. 3, the first expanding modules 101-105 respectively have first Ethernet connectors 1011, 1021, 1031, 1041 and 1051. The multiple first expanding modules 101-105 are connected to external Ethernet via individual first Ethernet connectors. In additional to the first Ethernet connectors, in an embodiment shown in FIG. 3, the first expanding module 101 has eight first connecting ports 1011-1018, and multiple first expanding modules 102-105 have the same number of first connecting ports as the first expanding module 101. The multiple first expanding modules 101-105 respectively have eight first connecting ports and the first connecting ports are used for connecting to a first external server to transmit data.

In an embodiment, each of the first connecting ports can provide four PCIE signal transmission channels. In other words, the first expanding modules 101-105 respectively has 32 PCIE signal transmission channels. The transmission speed of each PCIE signal transmission channel is 8 gigabits per second (Gb/s), so all the first expanding modules 101-105 have a transmission speed of 256 Gb/s. In other words, the server 1 provided in the disclosure can transmit huge data quantity via the disposed first expanding modules 101-105. Each the first expanding modules 101-105 does not interfere with other during data transmission. In the embodiment mentioned above, the disclosure does not intend to limit the number of first connecting ports of the first expanding modules 101-105. In another embodiment, the server 1 includes more first expanding modules. The disclosure has no limitation in the number of first expanding modules. In an embodiment, the multiple hardware connectors HC are separated in five groups which are controlled by first expanding modules 101-105 respectively.

As shown in FIG. 1 and FIG. 3, the multiple second expanding modules 111-112 are disposed at the second edge E2 of the main board 10 and on the first plane S1. The second expanding module 111 has four second connecting ports 1111-1114. The second expanding module 112 has the same number of second connecting ports as the second expanding module 111, and all the second connecting ports are used for connecting to a second external server. In an embodiment, the main board 10 can be coupled to multiple SSDs via the hardware connectors, and the multiple SSDs are separated in two groups which are controlled by the second expanding module 112 and the second expanding module 111 respectively for data transmission.

As shown in FIG. 1, the multiple third expanding modules 121-123 are disposed at the second edge E2 of the main board 10 and on the first plane S1. The main purpose of disposing multiple third expanding modules 121-123 is to preserve spaces for expansion. Users can plug different kinds of PCIE expansion cards via the multiple third expanding modules 121-123 based on actual demand. As shown in FIG. 3, in architecture, the multiple first expanding modules 101-105 are not adjacent with each other, the multiple second expanding modules 111-112 are not adjacent with each other and the multiple third expanding modules 121-123 are not adjacent with each other. In operation, all the multiple first expanding modules 101-105, the multiple second expanding modules 111-112 and the multiple third expanding modules 121-123 can operate respectively and does not be affected by other modules. For example, when the server 1 operates, only the first expanding module 101 and the second expanding module 111 are activated but other modules remain off. In an embodiment, besides preserving spaces for expansion, the multiple third expanding modules 121-123 further reserve power supplying connecting ports for supplying electric energy. It should be noticed that, in FIG. 3, the multiple first expanding modules 101-105, the multiple second expanding modules 111-112 and the multiple third expanding modules 121-123 are coated with shells. However, in FIG. 1, there's no casing covering any of the multiple first expanding modules 101-105, the multiple second expanding modules 111-112 and the multiple third expanding modules 121-123.

Figure 4:
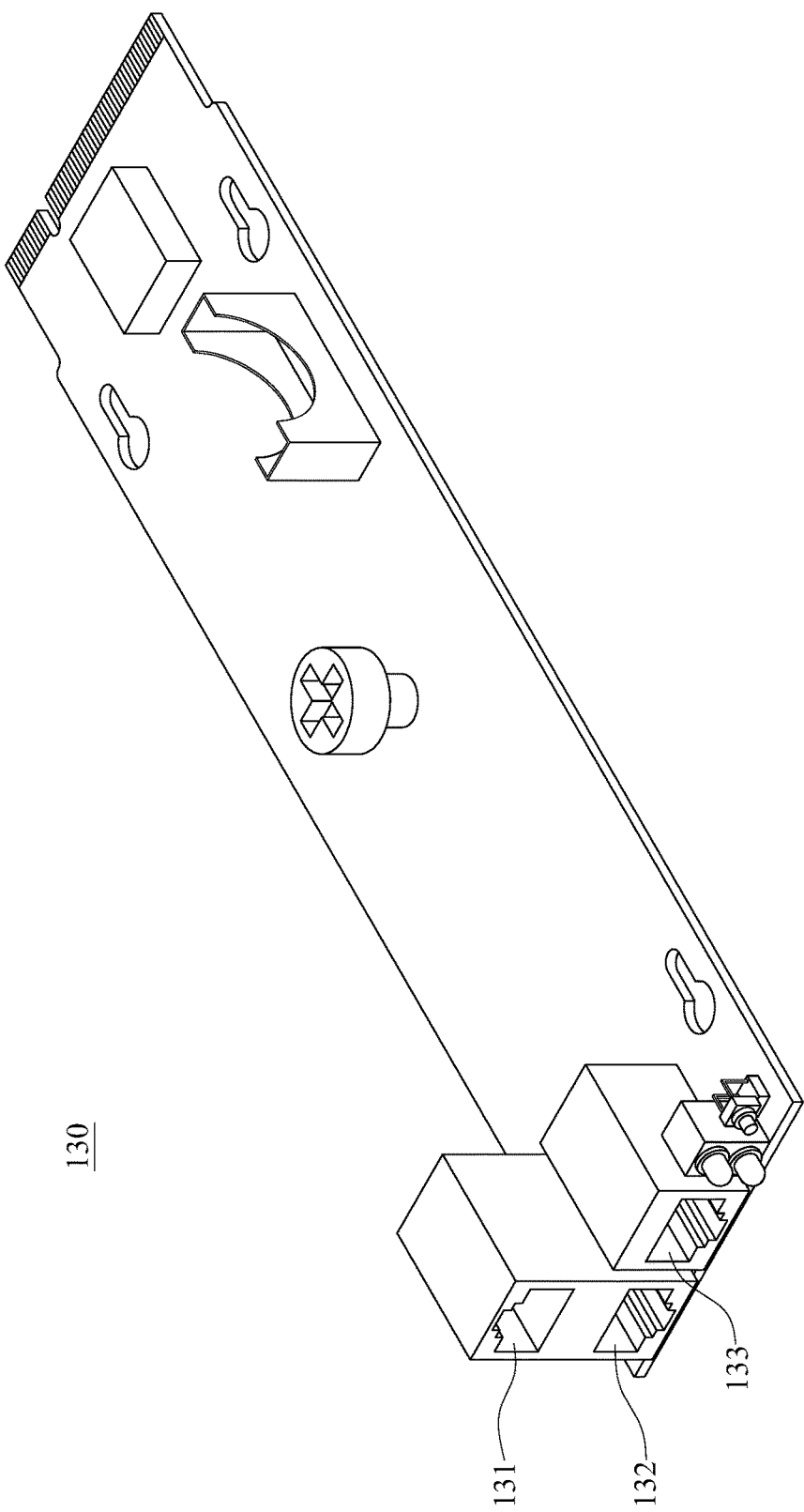
FIG. 4 is a schematic diagram of a management controlling board in an embodiment.

As shown in FIG. 1, the management controlling board 130 is disposed at the second edge E2 of the main board 10 and on the second plane S2. Please refer to FIG. 4. FIG. 4 is a schematic diagram of a management controlling board. As shown in FIG. 4, the management controlling board 130 has multiple second Ethernet connectors 131-133. In an embodiment, the second Ethernet connector 131 is coupled to the exchanger chip of the main board 10, and the host device can send a store command to the server 1 via remote monitoring of Ethernet. The second Ethernet connector 131 is coupled to peripheral management controllers (PMC) to monitor the real time state of the multiple first expanding modules 101-105, the multiple second expanding modules 111-112 and the multiple third expanding modules 121-123. The second Ethernet connector 133, which is coupled to a baseboard management controller (BMC), is capable of external projecting display or conducting basic input/output system (BIOS) management.

In an embodiment, each of the first expanding modules 101-105 has a first plugger, each of the second expanding modules 111-112 has a second plugger, and each of the third expanding modules 121-123 has a third plugger. As shown in FIG. 2, the main board 10 further includes multiple first connectors 20-28, multiple second connectors 30-31 and multiple third connectors 40-42. Each of the first expanding modules 101-105 is coupled to the main board via one of the multiple first connector 20-28 which are coupled to the first plugger. Each of the second expanding modules 111-112 is coupled to the main board 10 via one of the multiple second connectors 30-31 which are coupled to the second plugger. Each of the third expanding modules is coupled to the main board 10 via one of the multiple third connector 40-42 which are coupled to the third plugger.

Figure 5:
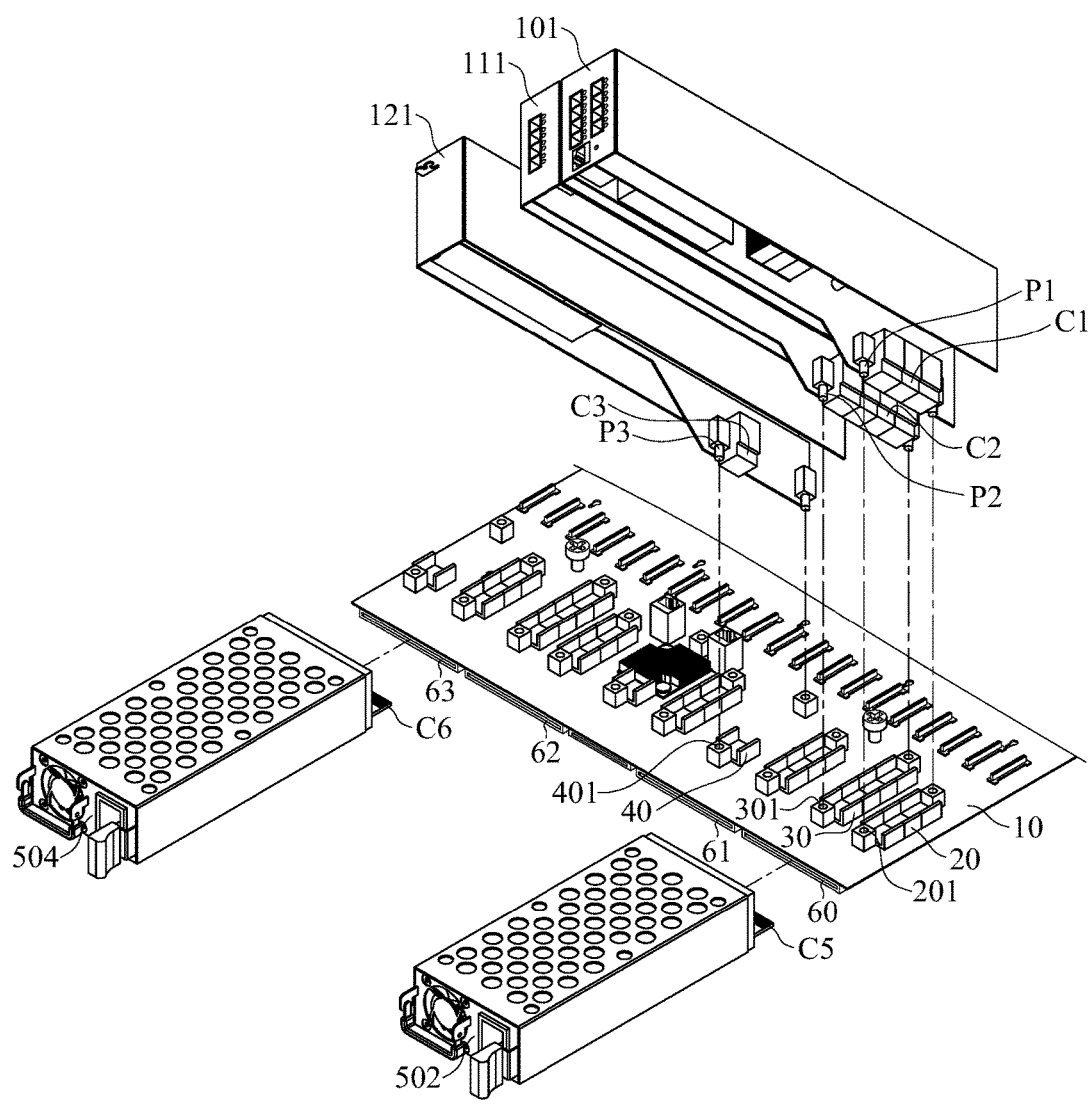
FIG. 5 is a breakdown drawing of a server in an embodiment.

For example, please refer to FIG. 5. FIG. 5 is a breakdown drawing of a server in an embodiment. As shown in FIG. 5, the first expanding module 101 has a first plugger C1, the second expanding module 111 has a second plugger C2, and the third expanding module 121 has a third plugger C3. The first connector 20, the second connector 30, and the third connector 40 of the main board 10 are respectively coupled to the first plugger C1 of the first expanding module 101, the second plugger C2 of the second expanding module 111, and the third plugger C3 of the third expanding module 121. On the basis of a concrete example, when a user need to expand the main board 10, the user couples the first plugger C1 of the first expanding module 101 to the first connector 20 of the main board 10 and then the first expanding module 101 is coupled to the main board 10. Similarly, when the user don not need the first expanding module 101, the user can remove the first expanding module 101 from the main board 10 easily. On the basis of another example, as shown in FIG. 5, the second connector 30 and the third connector 40 can be also coupled to the second connector 30 and the third connector 40 of the main board 10 respectively.

Please back to FIG. 2. In an embodiment, as shown in FIG. 2, the server 1 includes multiple first pin sets 201-205, multiple second pin sets 301-302 and multiple third pin sets 401-403, which are all on the main board 10. Each of the first pin sets 201-205 are used for guiding and fixed connecting one of the multiple first expanding modules. Each of the second pin sets 301-302 are used for guiding and fixed connecting one of the multiple second expanding modules 111-112. Each of the third pin sets 401-403 are used for guiding and fixed connecting one of the multiple third expanding modules 121-123. For example, the first pin set 201 is used for guiding and connecting the first expanding module 101 to the main board 10. The second pin set 301 is used for guiding and connecting the second expanding module 111 to the main board 10. The third pin set 401 is used for guiding and connecting the third expanding module 121 to the main board 10. In an embodiment, please refer to FIG. 2 and FIG. 5, the first pin set 201, the second pin set 301 and the third pin set 401 are all pore structure. The first expanding module 101, the second expanding module 111 and the third expanding module 121 respectively have bumpy sockets P1, P2 and P3 and can be respectively plugged in the mentioned pure structure. The respective connections between the sockets P1, P2 and P3 and the first pin set 201, the second pin set 301 and the third pin set 401 lead to the result of guiding and fixed connecting. In the case above, only the first expanding module 101, the second expanding module 111 and the third expanding module 121 are taken as examples to explain effectively. However, the person having ordinary skill in the art can get the result of guiding and fixed connecting the main board 10 of the first expanding modules 102-105, the second expanding module 112 and the third expanding modules 122-123 based on the same method.

In an embodiment, besides providing guiding and fixed connecting functions, the multiple first pin sets 201-205, the multiple second pin sets 301-302 and the multiple third pin sets 401-403 further supply power. Each of the first pin sets 201-205 supply power to one of the multiple first expanding modules 101-105, each of the second pin sets 301-302 supply power to one of the multiple second expanding modules 111-112, and each of the third pin sets 401-403 supply power to one of the multiple third expanding modules 121-123. For example, the first pin set 201 respectively supplies power to the first expanding module 101, the second pin set 301 respectively supplies power to the second expanding module 111, and the third pin set 401 respectively supplies power to the third expanding module 121.

In an embodiment, as shown in FIG. 2, the server 1 includes a processor PR which is disposed at the second edge E2 of the main board 10 and on the first plane S1, and corresponding to one of the third expanding modules 121-123. For example, as shown in FIG. 2, the processor PR is disposed among the pore structure of the third pin set 402, and corresponds to the third expanding module 122. In another embodiment, the processor PR is disposed among the pore structure of the third pin set 401 or the pore structure of the third pin set 403, and respectively corresponds to the third expanding module 121 or the third expanding module 123. In practice, the processor PR has cooling fin HS. The cooling fin HS is the metal which has great heat conductivity and light weight, and is easily processed (e.g. aluminum or copper). In an embodiment, the cooling fin HS is usually attached to a heating surface (e.g. main board 10) to provide the function of heat dissipation to increase the stability of system operation. If high temperature is generated during system operation, increasing the area of heat dissipation of the cooling fin HS is capable of providing higher heat dissipation efficiency.

Figure 6:
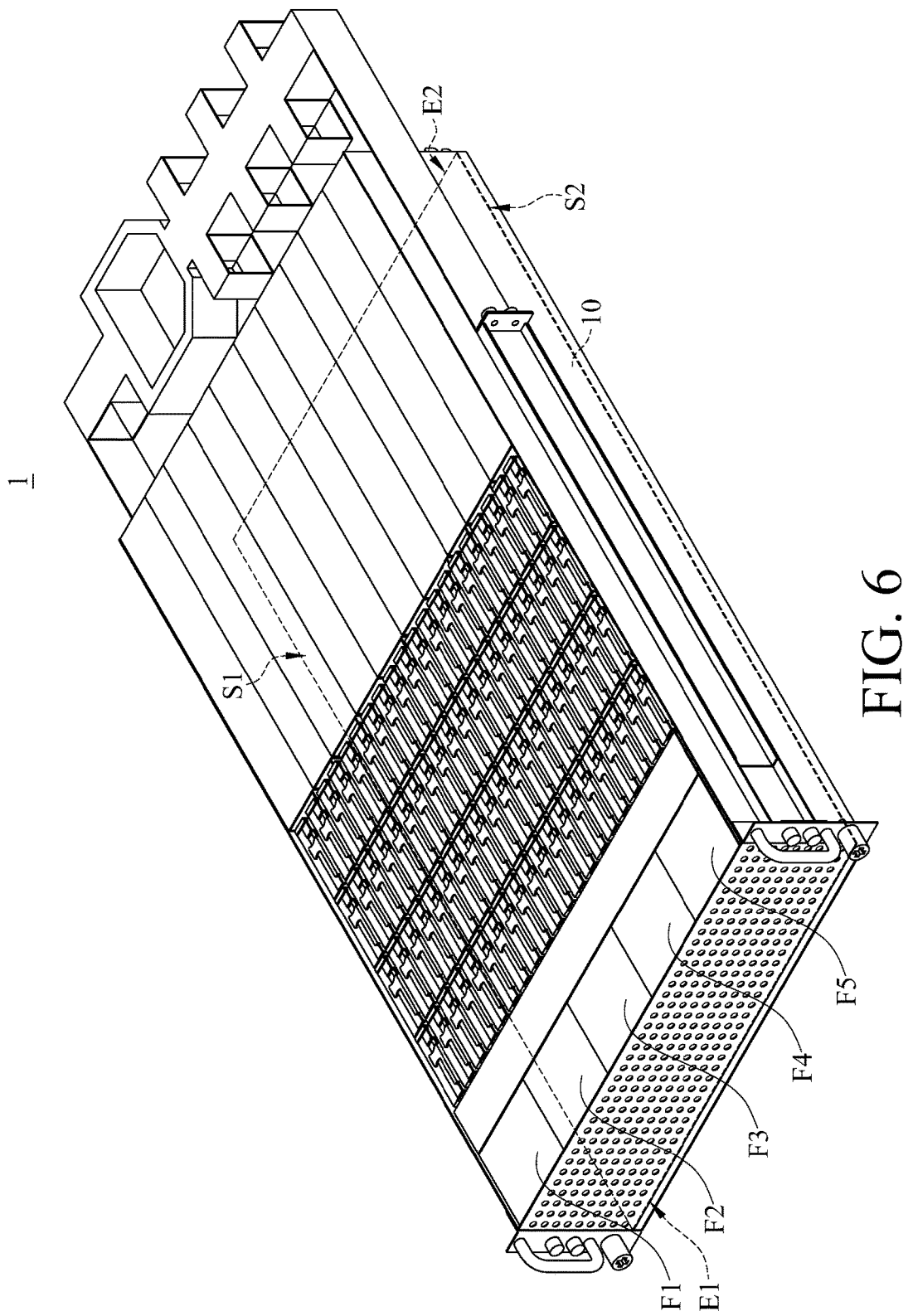
FIG. 6 is an appearance figure of a server in an embodiment.

Please refer to FIG. 1, FIG. 3, and FIG. 6. FIG. 6 is an appearance of a server in an embodiment. As shown in FIG. 3 and FIG. 6, the server 1 includes multiple fans F1-F5, multiple first power modules 501-502 and multiple second power modules 503-504. The multiple fans F1-F5 are disposed at the first edge E1 of the main board 10 and on the first plane S1, and respectively have a fourth plugger. The fans F1-F5 are coupled to one of the multiple fourth connectors 50-54 of the main board 10 via the respective fourth plugger as shown in FIG. 1. For example, the fourth plugger C4 of the fan F1 is capable of being coupled to the fourth connector 50 of the main board 10, and then the fans F1 is coupled to the main board 10. The multiple first power modules 501-502 and the multiple second power modules 503-504 are all disposed at the second edge E2 of the main board 10 and on the second plane S2. As shown in FIG. 3 and FIG. 5, the multiple first power modules 501-502 are disposed at the first side of the management controlling board 130 of a chassis, and the multiple second power modules 503-504 are disposed at the second side of the management controlling board 130 of a chassis. The second side is opposite to the first side. The first power modules 501-502 respectively have a fifth plugger, and are coupled to one of the multiple fifth connectors 60-61 of the main board 10 via the respective fifth plugger. The second power modules 503-504 respectively have a sixth plugger, and are coupled to one of the multiple sixth connectors 62-63 via the respective sixth plugger. For example, the first power module 502 is coupled to the fifth connector 60 of the main board 10 via the fifth plugger C5 and the second power module 504 is coupled to the sixth connector 63 of the main board 10 via the sixth plugger C6. In an embodiment, when at least two among the multiple first power modules 501-502 and the multiple second power modules 503-504 supply power normally, the server 1 operates normally.

More specifically, the server 1 is capable of operating normally as long as any two of the first power module 501, the first power module 502, the second power module 503 and the second power module 504 supply power normally. In an embodiment, if the first power module 501 and the second power module 503 are incapable of supplying power due to damage but the first power module 502 and the second power module 504 supply power normally, the server 1 is still capable of operating normally based on the power supplied by the first power module 502 and the second power module 504.

In an embodiment, each of the multiple first expanding modules 101-105, each of the multiple second expanding modules 111-112 and each of the multiple third expanding modules 121-123 include multiple indicator lamps. The multiple indicator lamps are disposed at the second edge E2 of the main board 10 and on the first plane S1. These indicator lamps are used for indicating states of hardware components. In an embodiment, when hardware components (e.g. HDD or SSD) are coupled to the main board 10 via hardware connectors and controlled by the first expanding module 101, the indicator lamps of the first expanding module 101 indicate the state of operation of the hard components. For example, as shown in FIG. 3, the first expanding module 101 includes the indicator lamps L1. When the hard components operate abnormally during data transmission, the first expanding module 101 is capable of getting the abnormal state of the hard components and then the indicator lamps L1 indicates red light. According to the red light, users can know the hardware components are under abnormal operation.

As set forth above, the server provided in this disclosure is capable of being coupled to multiple hardware components (e.g. SSD) via highly densely disposed hardware connectors, and leading to the operation of the server via the multiple first expanding modules, the multiple second expanding modules and the multiple third expanding modules which are coupled to the main board. The server provided in this disclosure is capable of supporting numerous storage devices (e.g. SSD conforming to NVMe), and reduce the complexity of signal traces by modularity. Moreover, the server provided in this disclosure is capable of being disassembled easily without any other tool to achieve convenience.

While this disclosure is described in terms of several embodiments above, these embodiments do not intend to limit this disclosure. It is therefore intended that the following appended claims be interpreted as including all such alterations, permutations, and equivalents as fall within the true spirit and scope of the present disclosure.

What is claimed is:

1. A server, comprising:
a main board having a first edge, a second edge opposite to the first edge, a first plane, and a second plane opposite to the first plane, wherein the main board comprises a plurality of hardware connectors, disposed on the first plane and between the first edge and the second edge, the main board is coupled to a plurality of hardware components via the plurality of hardware connectors, and the main board further comprises a plurality of first connectors, a plurality of second connectors and a plurality of third connectors;
a plurality of first expanding modules disposed at the second edge and on the first plane, wherein each of the first expanding modules has a first Ethernet connector, a first plugger and a plurality of first connecting ports, each of the first expanding modules is coupled to the main board via one of the plurality of first connectors which is coupled to the first plugger, and the plurality of first connecting ports are used for connecting to a first external server;
a plurality of second expanding modules disposed at the second edge and on the first plane, wherein each of the second expanding modules has a second plugger and a plurality of second connecting ports, each of the second expanding modules is coupled to the main board via one of the plurality of second connectors which is coupled to the second plugger, and the plurality of second connecting ports are used for connecting to a second external server;
a plurality of third expanding modules disposed at the second edge and on the first plane, wherein each of the third expanding modules has a third plugger, and is coupled to the main board via one of the plurality of third connectors which is coupled to the third plugger; and
a management controlling board disposed at the second edge and on the second plane, having a plurality of second Ethernet connectors;
wherein the plurality of first expanding modules are not adjacent with each other, the plurality of second expanding modules are not adjacent with each other, and the plurality of third expanding modules are not adjacent with each other.

2. The server according to claim 1, further comprising:
a plurality of first pin sets wherein each of the first pin sets is used for guiding and fixed connecting one of the plurality of first expanding modules;
a plurality of second pin sets wherein each of second pin sets is used for leading and setting one of the plurality of second expanding modules; and
a plurality of third pin sets wherein each of the third pin sets is used for leading and setting one of the plurality of third expanding modules.

3. The server according to claim 2, wherein each of the first pin sets supplies power to one of the plurality of first expanding modules, each of the second pin sets supplies power to one of the plurality of second expanding modules, each third pin sets supplies power to one of the plurality of third expanding modules.

4. The server according to claim 1, further comprising:
a processor located at the second edge of the main board and on the first plane, and corresponding to one of the third expanding modules.

5. The server according to claim 1, further comprising:
a plurality of fans wherein each of the fans has a fourth plugger, the plurality of fans are disposed at the first edge of the main board and on the first plane, and each of the fans is coupled to one of a plurality of fourth connectors of the main board via the fourth plugger;
a plurality of first power modules wherein each of the first power modules has a fifth plugger, the plurality of first power modules are disposed at the second edge of the main board and on the second plane, and at a first side of the management controlling board of a chassis and each of the first power modules is coupled to one of a plurality of fifth connectors of the main board via fifth plugger; and
a plurality of second power modules wherein each of the second power modules has a sixth plugger, the plurality of second power modules are disposed at the second edge of the main board and at the second plane, and at a second side of the management controlling board of the chassis, the second side is opposite to the first side, and each of the second power modules is coupled to one of a plurality of sixth connectors of the main board via the sixth plugger.

6. The server according to claim 5, wherein when at least two among the plurality of first power modules and the plurality of second power modules supply power normally, the server operates normally.

7. The server according to claim 1, wherein the plurality of hardware components are a plurality of hard disks.

8. The server according to claim 7, wherein each of the plurality of first expanding modules, the plurality of second expanding modules and the plurality of third expanding modules include a plurality of indicator lamps, the plurality of indicator lamps are disposed at the second edge of the main board, are disposed on the first plane, and are used for indicating states of the plurality of the hardware components.

* * * * *